(12) United States Patent
Torek et al.

(10) Patent No.: US 7,541,635 B2
(45) Date of Patent: *Jun. 2, 2009

(54) SEMICONDUCTOR FABRICATION USING A COLLAR

(75) Inventors: Kevin Torek, Meridian, ID (US); Kevin Shea, Boise, ID (US); Niraj B. Rana, Boise, ID (US); Zhiping Yin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 207 days.

This patent is subject to a terminal disclaimer.

(21) Appl. No.: 11/490,770

(22) Filed: Jul. 21, 2006

(65) Prior Publication Data

US 2006/0261395 A1    Nov. 23, 2006

Related U.S. Application Data

(62) Division of application No. 10/788,977, filed on Feb. 27, 2004, now Pat. No. 7,109,089.

(51) Int. Cl.
*H01L 27/108* (2006.01)
*H01L 29/94* (2006.01)

(52) U.S. Cl. .............................. 257/306; 257/E27.094
(58) Field of Classification Search .................. None
See application file for complete search history.

(56) References Cited

U.S. PATENT DOCUMENTS

| | | | |
|---|---|---|---|
| 5,994,153 | A | 11/1999 | Nagel et al. |
| 6,121,083 | A | 9/2000 | Matsuki |
| 6,180,452 | B1 | 1/2001 | Figura |
| 6,190,989 | B1 | 2/2001 | Roberts |
| 7,109,089 | B2 | 9/2006 | Torek et al. |
| 2005/0191805 | A1 | 9/2005 | Torek et al. |

*Primary Examiner*—Evan Pert
*Assistant Examiner*—Ben P Sandvik
(74) *Attorney, Agent, or Firm*—Schwegman, Lundberg & Woessner, P.A.

(57) ABSTRACT

In one embodiment, a method includes selectively depositing a collar material between a number of memory containers. The collar material along a side of a first memory container of the number of memory containers is in contact with the collar material along a side of a second memory container. An opening exists between the collar material along a corner of the memory container and the collar material along a corner of a third memory container.

19 Claims, 14 Drawing Sheets

SEMICONDUCTOR FABRICATION USING A COLLAR

This application is a Divisional of U.S. application Ser. No. 10/788,977, filed Feb. 27, 2004 now U.S. Pat. No. 7,109,089, which is incorporated herein by reference.

FIELD OF THE INVENTION

The present invention relates generally to the field of semiconductor fabrication, and more particularly to semiconductor fabrication using a collar.

BACKGROUND

Semiconductors are used extensively in today's electronic devices. Their miniature size and low power requirements enable highly complex circuits to be used in places never before thought possible. This has led to the development of systems with the speed and power to make our lives easier without encumbering us with bulky boxes and power-hungry electronics. One of the keys to both light weight and energy efficiency is the tiny size of the circuitry. With each new generation of circuit technology, comes smaller and smaller device sizes.

Many electronic systems include a memory device, such as a Dynamic Random Access Memory (DRAM), to store data. A typical DRAM includes an array of memory cells. Each memory cell includes a capacitor that stores the data in the cell and a transistor that controls access to the data. The capacitor includes two conductive plates. The top plate of each capacitor is typically shared, or common, with each of the other capacitors. This plate is referred to as the "top cell plate." The charge stored across the capacitor is representative of a data bit and can be either a high voltage or a low voltage. Data can be either stored in the memory cells during a write mode, or data may be retrieved from the memory cells during a read mode. The data is transmitted on signal lines, referred to as digit lines, which are coupled to input/output (I/O) lines through transistors used as switching devices. Typically, for each bit of data stored, its true logic state is available on an I/O line and its complementary logic state is available on an I/O complement line. Thus, each such memory cell has two digit lines, digit and digit complement.

Typically, the memory cells are arranged in an array and each cell has an address identifying its location in the array. The array includes a configuration of intersecting conductive lines, and memory cells are associated with the intersections of the lines. In order to read from or write to a cell, the particular cell in question must be selected, or addressed. The address for the selected cell is represented by input signals to a word line decoder and to a digit line decoder. The word line decoder activates a word line in response to the word line address. The selected word line activates the access transistors for each of the memory cells in communication with the selected word line. The digit line decoder selects a digit line pair in response to the digit line address. For a read operation, the selected word line activates the access transistors for a given word line address, and data is latched to the digit line pairs.

Some circuit devices utilize "container" structures, and such container structures are often utilized as a capacitor for a memory cell due to their efficient use of semiconductor die real estate. After formation, these container structures look like tiny holes within the surrounding material. They will generally have a closed bottom, an open top and side walls extending between the closed bottom and open top. Typically, containers that will be formed into capacitor structures will have dimensions that are taller than they are wide, often referred to as a "high aspect-ratio." This high aspect-ratio of container capacitors can allow the capacitor to store more energy while maintaining the same two-dimensional surface area.

However, capillary forces may cause the container structures of the memory array to lean and/or stick together. In particular, because of the proximity of these container structures, capillary forces caused by an absorption layer formed during the removal of certain materials (e.g., an oxide) may cause the container structures to be pulled together.

For the reasons stated above, for other reasons stated below, and for other reasons which will become apparent to those skilled in the art upon reading and understanding the present specification, there is a need in the art for an improved method, apparatus and system for fabrication of a memory array.

BRIEF DESCRIPTION OF THE DRAWINGS

Embodiments of the invention may be best understood by referring to the following description and accompanying drawings which illustrate such embodiments. The numbering scheme for the Figures included herein are such that the leading number for a given reference number in a Figure is associated with the number of the Figure. For example, a memory array 100 can be located in FIG. 1. However, reference numbers are the same for those elements that are the same across different Figures. In the drawings.

DETAILED DESCRIPTION

Figure 1:
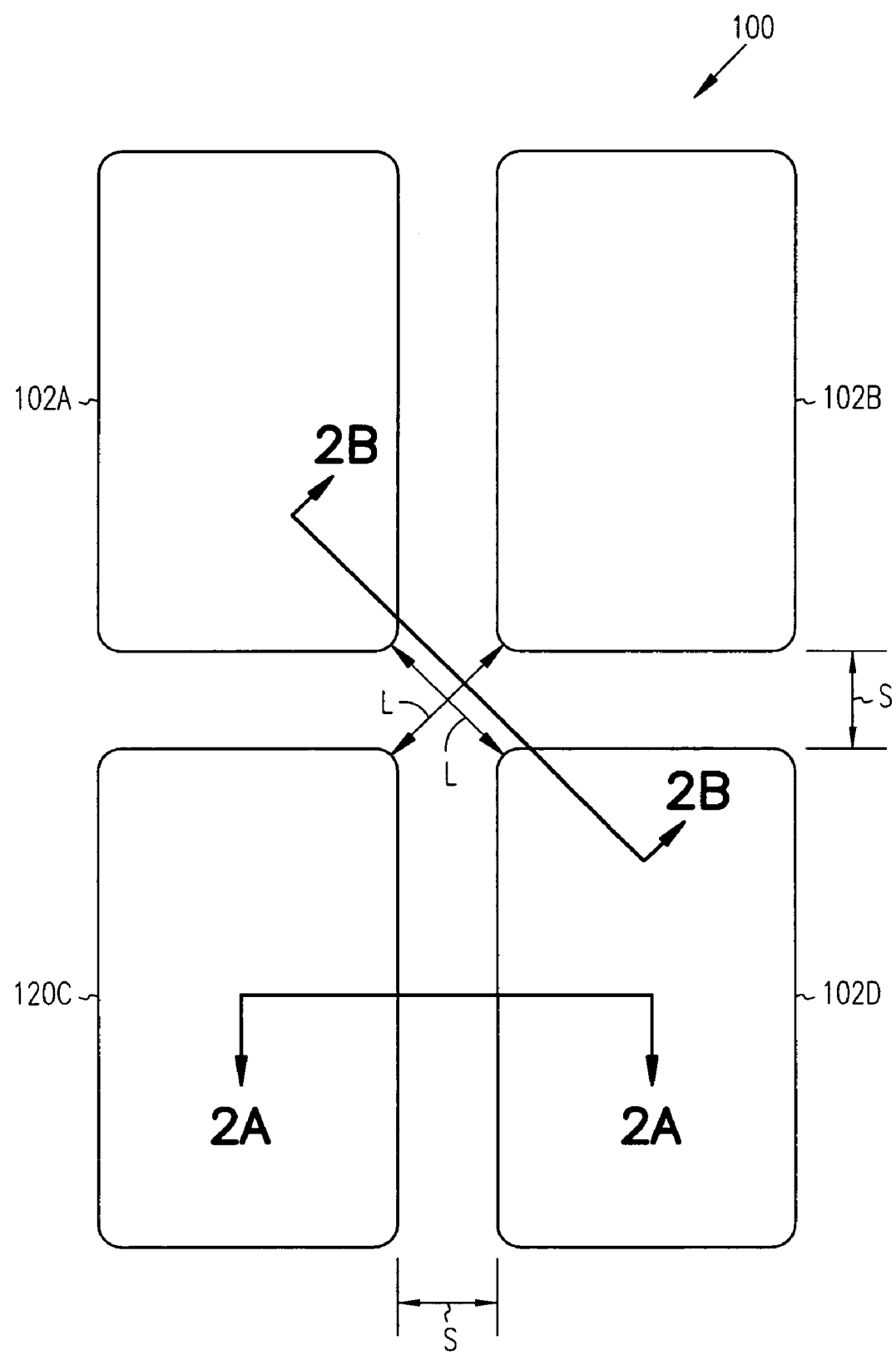
FIG. 1 illustrates a top view of a memory array, according to one embodiment of the invention.

Methods, apparatuses and systems for different embodiments for semiconductor fabrication using a collar are described. In the following detailed description of the embodiments, reference is made to the accompanying drawings which form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention.

While described with reference to memory containers for fabrication of a memory array, embodiments of the invention may be used for fabrication of any other type of integrated circuit. For example, embodiments of the invention may be used to fabricate other circuits, wherein the proximity of the structures is such that capillary forces may cause the structures to lean and/or stick together. The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. The following detailed description is, therefore, not to be taken in a limiting sense, and the scope of the present invention is defined only by the appended claims and their equivalents. It is noted that for purposes of interpreting this disclosure and the claims that follow, the spacial reference terms "on", "over", "above", "beneath" and the like are utilized to describe relative orientations of various elements to one another. The terms are not utilized in an absolute and global sense relative to any external reference. Accordingly, a first material recited as being "beneath" a second material defines a reference of the two materials to one another, but does not mean that the first material would actually be "under" the second material relative to any reference external of the two materials.

References in the specification to "one embodiment", "an embodiment", "an example embodiment", etc., indicate that the embodiment described may includes a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

FIG. 1 illustrates a top view of a memory array, according to one embodiment of the invention. In particular, FIG. 1 illustrates a memory array 100 that includes a memory container 102A, a memory container 102B, a memory container 102C and a memory container 102D. While FIG. 1 illustrates the memory array 100 having four different memory containers, embodiments of the invention are not so limited, as the memory array 100 may include a lesser or greater number of such memory containers. In one embodiment, the memory containers 102A-102D are doubled-sided container capacitors wherein a first electrode is surrounded on two sides by a second electrode for a given capacitor.

As shown, the memory container 102C is adjacent to the memory container 102D along a first direction, wherein these two different containers are separated by a distance S. The memory container 102A is adjacent to the memory container 102B along the first direction, wherein these two different containers are separated by the distance S. The memory container 102D is also adjacent to the memory container 102A along a second direction, wherein these two different containers are separated by a distance L. The memory container 102A is adjacent to the memory container 102C along a third direction, wherein these two different containers are separated by the distance S. The memory container 102B is adjacent to the memory container 102D along the third direction, wherein these two different containers are separated by the distance S.

In one embodiment, the distance S is less than the distance L. Accordingly, in such a geometric configuration, the memory containers 102A-102D are closer together along a first direction (distance S) in comparison to a second direction (distance L). The cross section AA along the first and the third directions (distance S) is illustrated in more detail below in conjunction with FIG. 2A. The cross section BB along the second direction (distance L) is illustrated in more detail below in conjunction with FIG. 2B.

In an embodiment, the memory container 102A, the memory container 102B, the memory container 102C and/or the memory container 102D include a liner that may be disposable. In one embodiment, the liner includes TiN. In an embodiment, the liner includes a number of different poly-based materials. Those skilled in the art will recognize that a wide variety of materials can be substituted for the different liner material described here, without departing from the scope of the appended claims. Moreover, the liners may be removed based on a number of different operations during the fabrication. In one embodiment, the liner is etched with an etchant comprising a piranha-based solution. In an embodiment, the liner is etched with an etchant comprising tetramethyl ammonium hydroxide (TMAH). Those skilled in the art will recognize that a wide variety of etchants can be substituted for the etchants described here, without departing from the scope of the appended claims.

As further described below, a collar material may be deposited external to and between the memory containers 102 and not within the memory containers 102. For example, the memory containers 102 may be filled with a material during the deposition of the collar material. In some embodiments, the memory containers 102 may be at least partially hollowed out prior to the deposition of the collar material. Accordingly, the collar material may be deposited internal and external to the memory containers 102. In other words, in some embodiments, the collar material may be deposited on both sides of the walls of the memory containers 102.

Figure 2A:
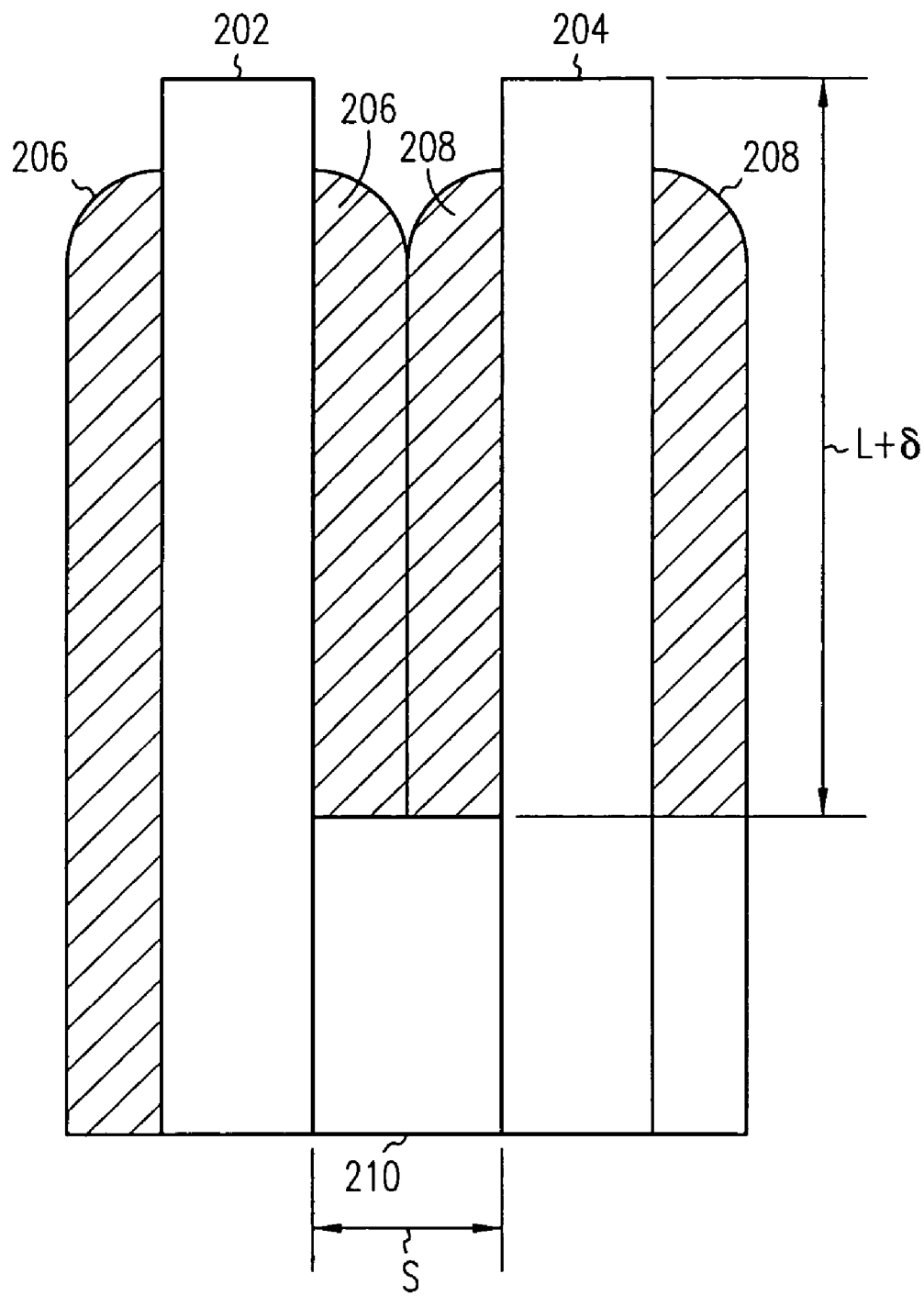
FIG. 2A illustrates a vertical cross-sectional view of a memory array along a first direction, according to one embodiment of the invention.

FIG. 2A illustrates a vertical cross-sectional view of a memory array along a first direction, according to one embodiment of the invention. As shown, the cross-section AA includes a first electrode 202 and a second electrode 204 that are at a distance S in relation to each other. Referring back to FIG. 1, the first electrode 202 is within the side wall of the memory container 102C. The second electrode 204 is within the side wall of the memory container 102D. The memory array 100 (including the memory container 102C and the memory 102D) are formed within a mold 210 (which is further described below).

A first collar (spacer) 206 is formed along the sides of the first electrode 202 and on top of the mold 210. As shown, the first collar 206 has a width of at least S/2 in the first direction (toward the second electrode 204). A second collar (space) 208 is formed along the sides of the second electrode 204 and on top of the mold 210. As shown, the second collar 208 has a width of at least S/2 in the first direction (toward the first electrode 202). In one embodiment, as shown, the deposition depth of first collar 206 (adjacent to the second electrode 204) and the second collar 208 (adjacent to the first electrode 204) is greater than L (L+∂).

In other words, the first collar 206 is connected to the second collar 208. Accordingly, the memory container 102C is connected to the memory container 102D through the first collar 206 and the second collar 208. As described in more detail below, the first collar 208 and the second collar 208 provide support that precludes the memory container 102C and the memory container 102D from leaning and/or sticking together during other fabrication operations.

Figure 2B:
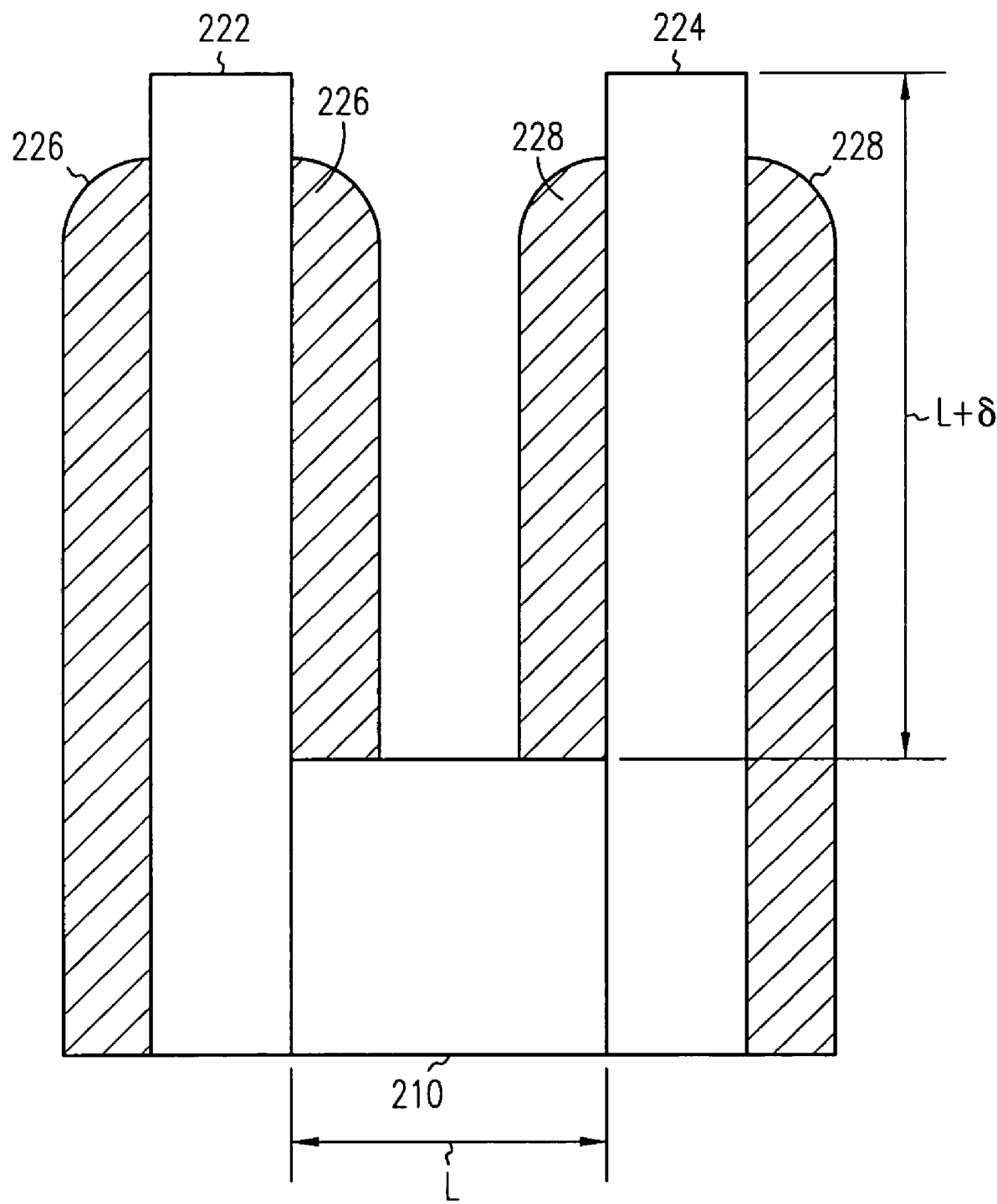
FIG. 2B illustrates a vertical cross-sectional view of a memory array along a second direction, according to one embodiment of the invention.

FIG. 2B illustrates a vertical cross-sectional view of a memory array along a second direction, according to one embodiment of the invention. As shown, the cross-section BB includes a first electrode 222 and a second electrode 224 that are at a distance L in relation to each other. Referring back to FIG. 1, the first electrode 222 is within the side wall of the memory container 102A. The second electrode 224 is within the side wall of the memory container 102D. As shown, the memory container 102A and the memory container 102D are formed within the mold 210.

A first collar (spacer) 226 is formed along the sides of the first electrode 222 and on top of the mold 210. As shown, the first collar 226 has a width that is less than L/2 in the second direction (toward the second electrode 224). A second collar (space) 228 is formed along the sides of the second electrode 224 and on top of the mold 210. As shown, the second collar 228 has a width that is less than L/2 in the second direction (toward the first electrode 222). In one embodiment, as shown, the deposition depth of first collar 226 (adjacent to the second electrode 224) and the second collar 228 (adjacent to the first electrode 224) is greater than L (L+∂).

In other words, the first collar 226 is not in direct contact with the second collar 228. Accordingly, a space/opening remains between the first collar 226 and the second collar 228. As further described in more detail below, this space will enable the removal of the mold 210. In particular, the geometric configuration of the memory array 100 is such that the collars 206 and 208 provide support for the memory containers 102 in the first direction, while enabling access to the underlying mold 210. Such support precludes the memory containers 102 from leaning and/or sticking together (due to capillary forces) during a wet etching of the underlying mold 210.

While the first electrode 202, the second electrode 204, the first electrode 222 and/or the second electrode 224 may be formed from any of a number of different conductive materials, in one embodiment, the first electrode 202, the second electrode 204, the first electrode 222 and/or the second electrode 224 include a poly silicon. In an embodiment, the first electrode 202, the second electrode 204, the first electrode 222 and/or the second electrode 224 include a titanium nitride.

The deposition of the collar on both sides of the electrodes (on both sides of the side walls of the memory containers having these electrodes) allows for the stabilization of the electrodes during etch back of the mold 210. Accordingly, thinner electrodes may be used. However, embodiments of the invention are not so limited. In one embodiment, it may be necessary to preclude the collar from being deposited in the memory containers 102, a spin-on glass could be used for 17 coat/bake. For example, in one embodiment, the memory containers 102 may be smaller at the bottom, thereby causing the subsequent removal to be difficult.

Figure 3:
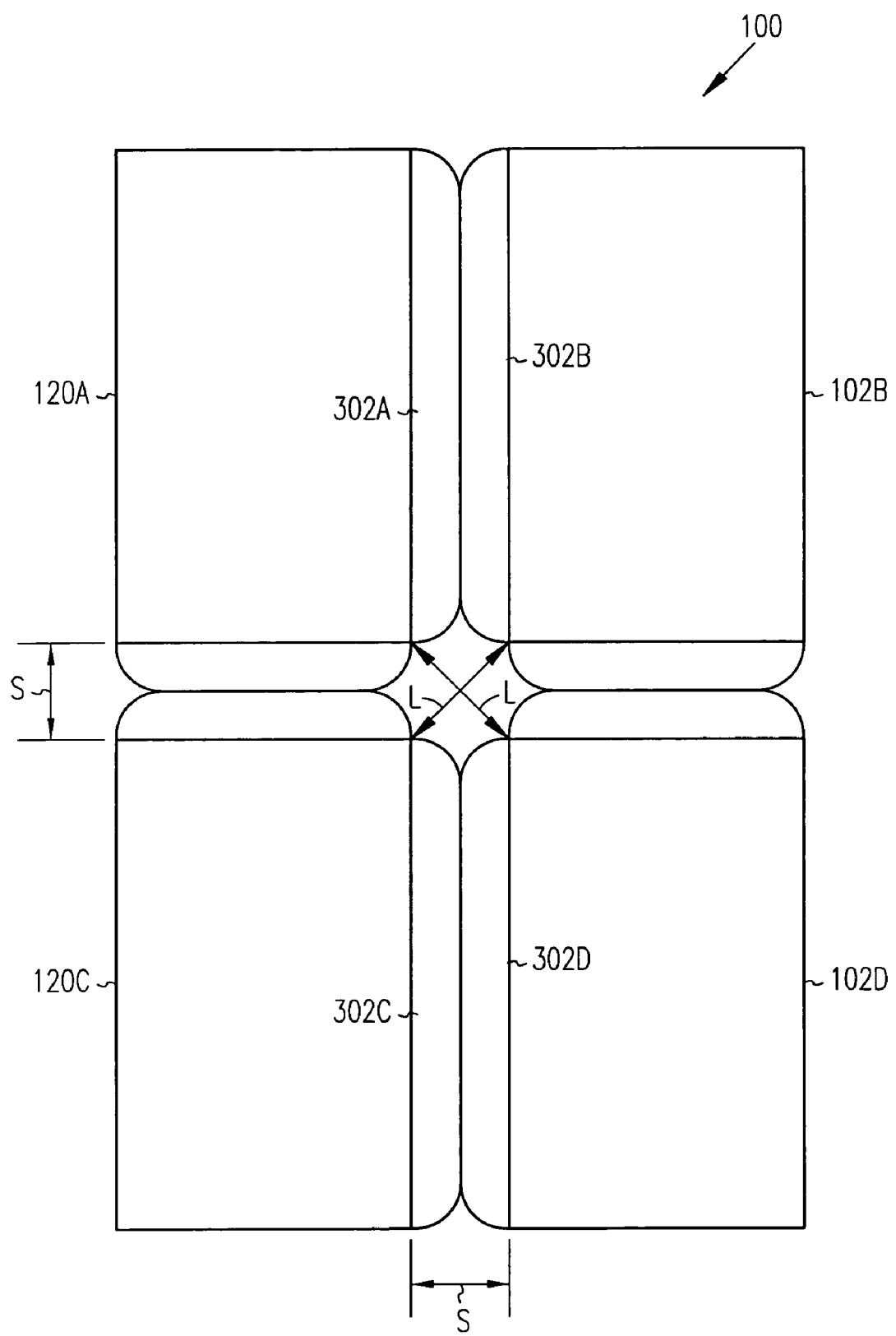
FIG. 3 illustrates a top view of a memory array having a collar, according to one embodiment of the invention.

FIG. 3 illustrates a top view of a memory array having a collar, according to one embodiment of the invention. The memory array 100 includes the memory containers 102A-102D (as shown in FIG. 1). The memory array 100 includes a collar 302A along the side wall of the memory container 102A. The memory array 100 includes a collar 302B along the side wall of the memory container 102B. The memory array 100 includes a collar 302C along the side wall of the memory container 102C. The memory array 100 includes a collar 302D along the side wall of the memory container 102D.

Additionally, as shown, the collar 302A is in contact with the collar 302B in the first direction along the S distance. The collar 302C is in contact with the collar 302D in the first direction along the S distance. The collar 302A is in contact with the collar 302C in the third direction that is along the S distance. The collar 302B is in contact with the collar 302D in the third direction that is also along the S distance. The collar 302A is not in contact with the collar 302D in the second direction along the L distance. The collar 302B is not in contact with the collar 302C in the second direction along the L distance. Although not shown, in some embodiments, the collar material may also be deposited within the memory containers 102 such that the collars are on both sides of the walls of the memory containers 102.

Figure 4A:
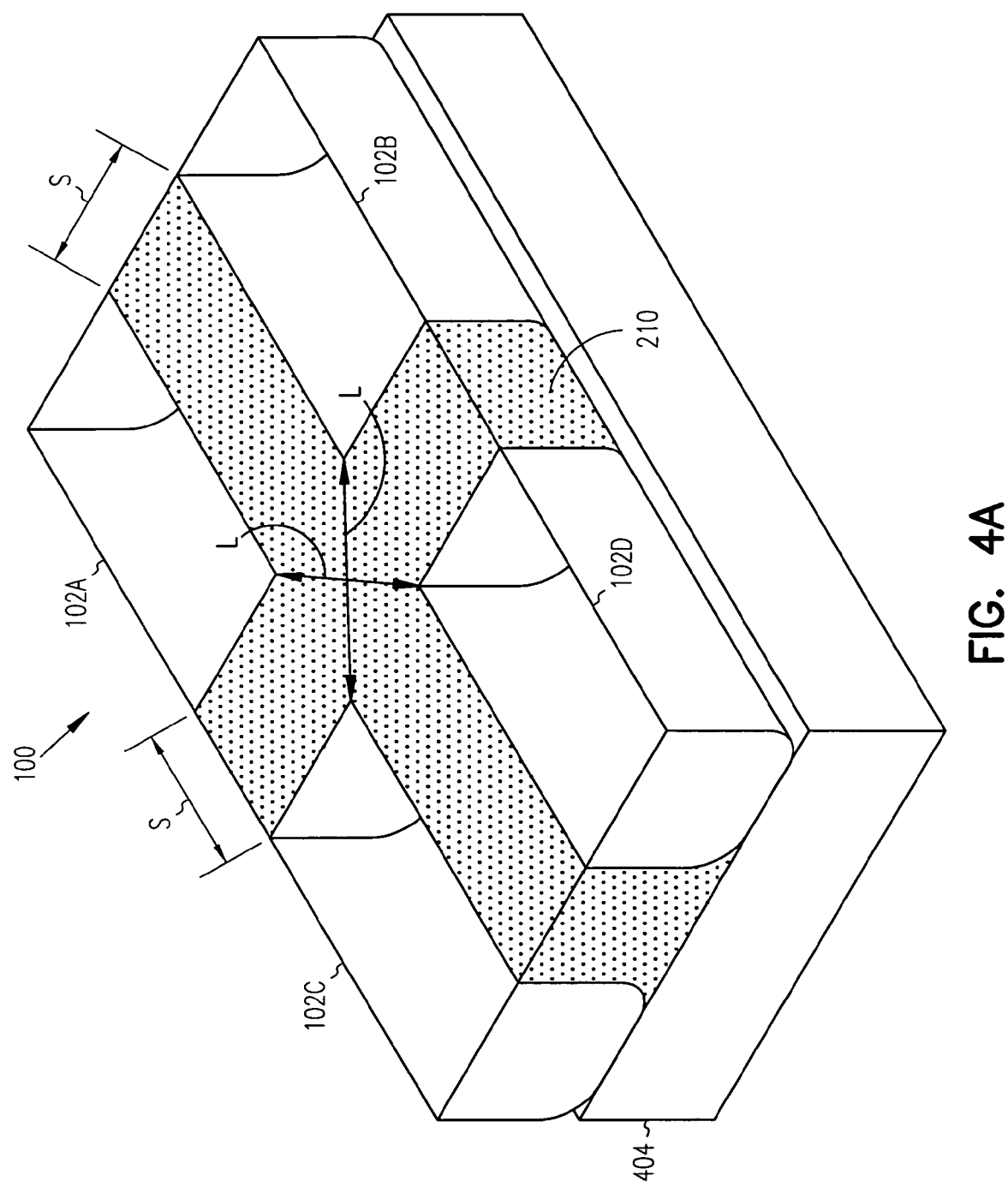
FIG. 4A illustrates a cross-sectional view of a memory array at a first stage of fabrication, according to one embodiment of the invention.

FIGS. 4A-4F illustrate cross-sectional views of the memory array 100 across a number of fabrication operations, according to one embodiment of the invention. FIG. 4A illustrates a cross-sectional view of a memory array at a first stage of fabrication, according to one embodiment of the invention. As shown, the memory array 100 includes the memory container 102A, the memory container 102B, the memory container 102C and the memory container 102D that have been formed in a mold 210 on a substrate 404. The memory containers 102A-102D may be formed on the substrate 404 using techniques well known in the art, including doping, etching, masking, deposition, etc., or a combination thereof.

FIG. 4A illustrates that the memory container 102C is at the distance S from the memory container 102D (as described above in conjunction with the description of FIG. 1). The memory container 102A is at the distance S from the memory container 102B and the memory container 102C. The memory container 102B is at the distance S from the memory container 102D. FIG. 4A also illustrates that the memory container 102D is at the distance L from the memory container 102A. The memory container 102C is at the distance L from the memory container 102B.

In one embodiment, the mold 210 includes borophosphosilicate glass (BPSG). In an embodiment, the mold 210 includes phosphosilicate glass (PSG). In an embodiment, the mold 210 includes tetraethylortho-silicate (TEOS). In one embodiment, the mold 210 includes SA TEOS. In an embodiment, the mold 210 includes SiLK (which is a registered trademark of Dow Chemical company for a low-k dielectric resin). Those skilled in the art will recognize that a wide variety of materials can be substituted for the different mold material described here, without departing from the scope of the appended claims.

Figure 4B:
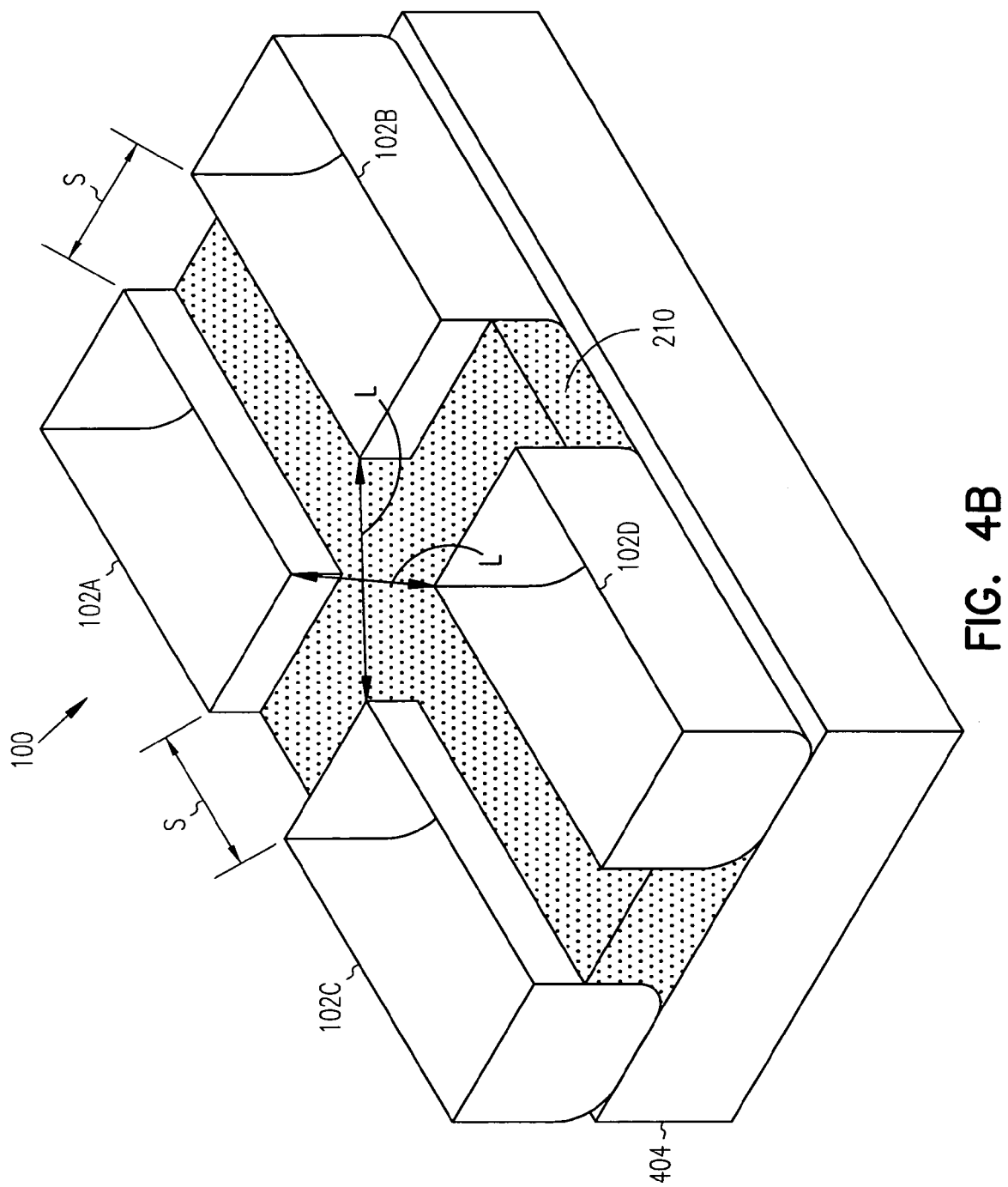
FIG. 4B illustrates a cross-sectional view of a memory array of FIG. 4A at a later stage of fabrication, according to one embodiment of the invention.

FIG. 4B illustrates a cross-sectional view of a memory array of FIG. 4A at a later stage of fabrication, according to one embodiment of the invention. In particular, referring to FIG. 4B, the method continues with the etching of the mold 210. In one embodiment, the mold 210 is etched back to a depth of at least a distance that is greater than L (L+∂). In one embodiment, the mold 210 is etched back with hydrogen fluoride (HF). In an embodiment, the mold 210 is etched back with acetic acid. In an embodiment, the mold 210 is etched back with a combination of hydrogen fluoride and acetic acid. In one embodiment, the mold 210 is etched back with propyleneglycol monomethylether acetate (PGMEA). Those skilled in the art will recognize that a wide variety of etchants can be substituted for the different etchants used to etch back the mold 210 described here, without departing from the scope of the appended claims.

Figure 4C:
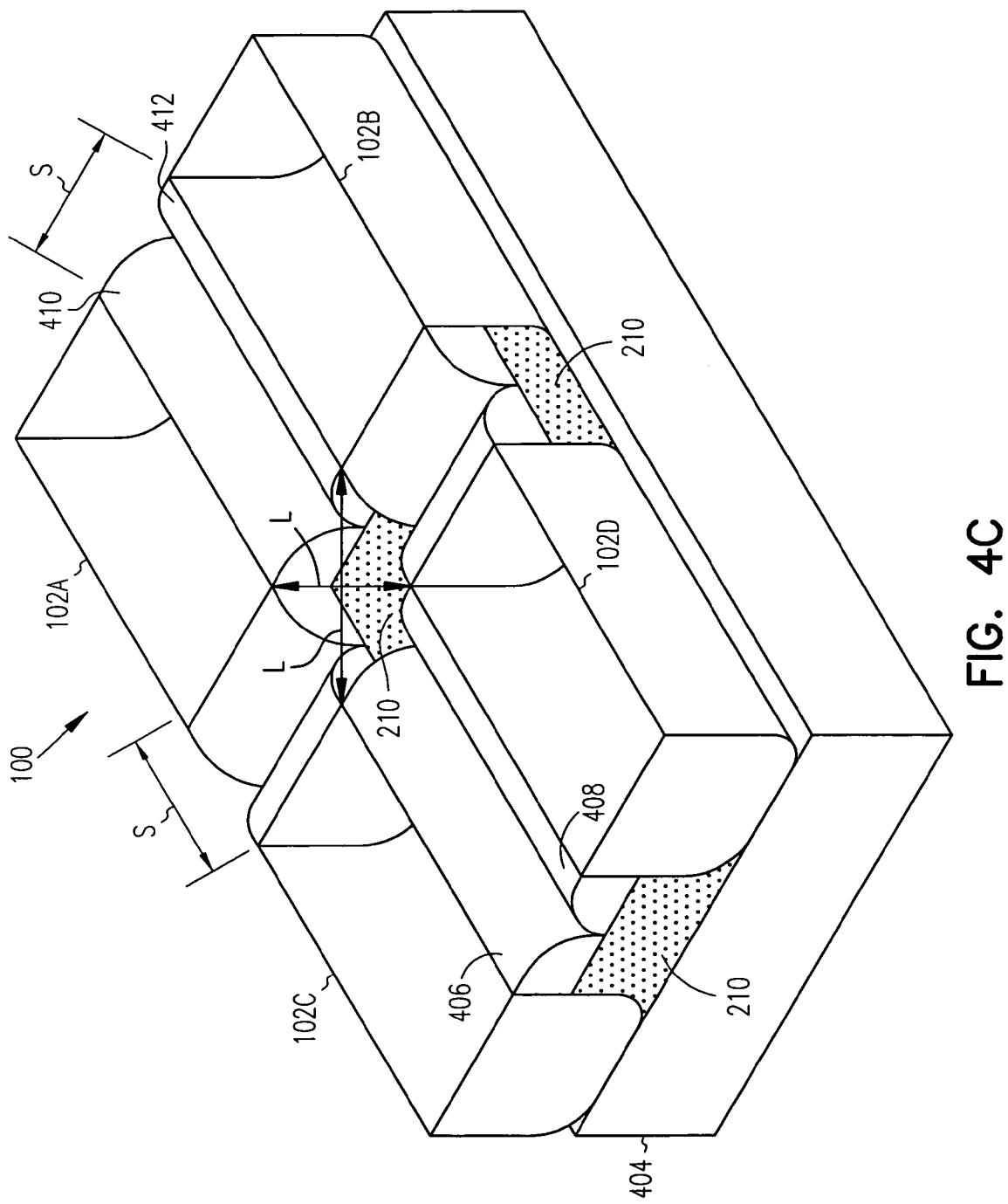
FIG. 4C illustrates a cross-sectional view of a memory array of FIG. 4B at a later stage of fabrication, according to one embodiment of the invention.

FIG. 4C illustrates a cross-sectional view of a memory array of FIG. 4B at a later stage of fabrication, according to one embodiment of the invention. In particular, referring to FIG. 4C, the method continues with the deposition of the collar material along the side walls of the memory containers 102A-102D and on top of the etched back mold 210. As shown, the deposition of the collar material in the first direction is greater than S/2. Accordingly, the collar material (a collar 406) deposited on the side wall of the memory container 102C is in contact with the collar material (a collar 408) deposited on the side wall of the memory container 102D. The collar material (a collar 410) deposited on the side wall of the memory container 102A is in contact with the collar material (a collar 412) deposited on the side wall of the memory container 102B. For the sake of clarity, the collars along the third direction along the S distance are not shown. However, in one embodiment, such collars are in contact with the each other (as shown in FIG. 3).

Additionally, as better illustrated by FIGS. 1-3, the collar material deposited on a corner of the memory container 102A is not in direct contact with the collar material deposited on a corner of the memory container 102D. The collar material deposited on a corner of the memory container 102C is not in direct contact with the collar material deposited on a corner of the memory container 102B. Therefore, this space/opening will enable the removal of the mold 210. In particular, the geometric configuration of the memory array 100 is such that the collars provide support for the memory containers 102 in the first and third direction (along the S distance), while enabling access to the underlying mold 210 through the space between the collars in the second direction (along the L distance). Such support precludes the memory containers 102 from leaning and/or sticking together (due to capillary forces) during a wet etching of the underlying mold 210.

In one embodiment, the collar material (the collar 206, the collar 208, the collar 226 and the collar 228) includes a boron doped carbon film. In an embodiment, the collar material includes silicon nitride. Those skilled in the art will recognize that a wide variety of materials can be substituted for the different collar material described here, without departing from the scope of the appended claims.

In some embodiments, the memory containers 102 may be filled with a material during the deposition of the collar material to preclude the deposition of the collar material into the memory containers 102. In some embodiments, the memory containers 102 may be at least partially hollowed out prior to the deposition of the collar material. Accordingly, the collar material may be deposited internal and external to the memory containers 102. In other words, in some embodiments, the collar material may be deposited on both sides of the walls of the memory containers 102.

Figure 4D:
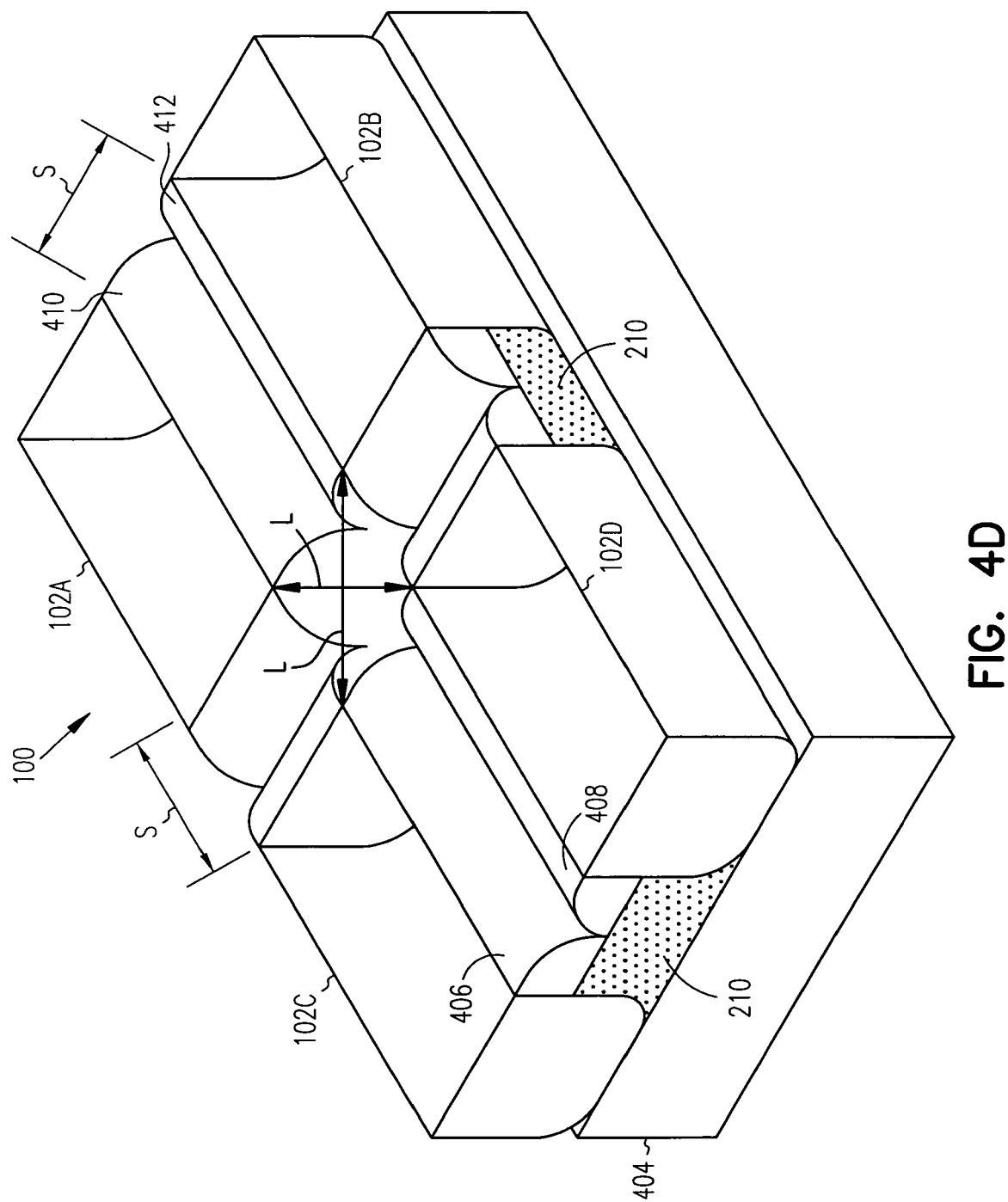
FIG. 4D illustrates a cross-sectional view of a memory array of FIG. 4C at a later stage of fabrication, according to one embodiment of the invention.

FIG. 4D illustrates a cross-sectional view of a memory array of FIG. 4C at a later stage of fabrication, according to one embodiment of the invention. In particular, referring to FIG. 4D, the method continues with the removal of the mold 402 in the space between the collar 226 and the collar 228. In particular, the mold 402 is accessible along the second direction (the L distance) because the collars are not in direct contact with each other (as shown in FIG. 3). In one embodiment, the mold 210 is removed from this space using any of a number of different dry etch operations.

Figure 4E:
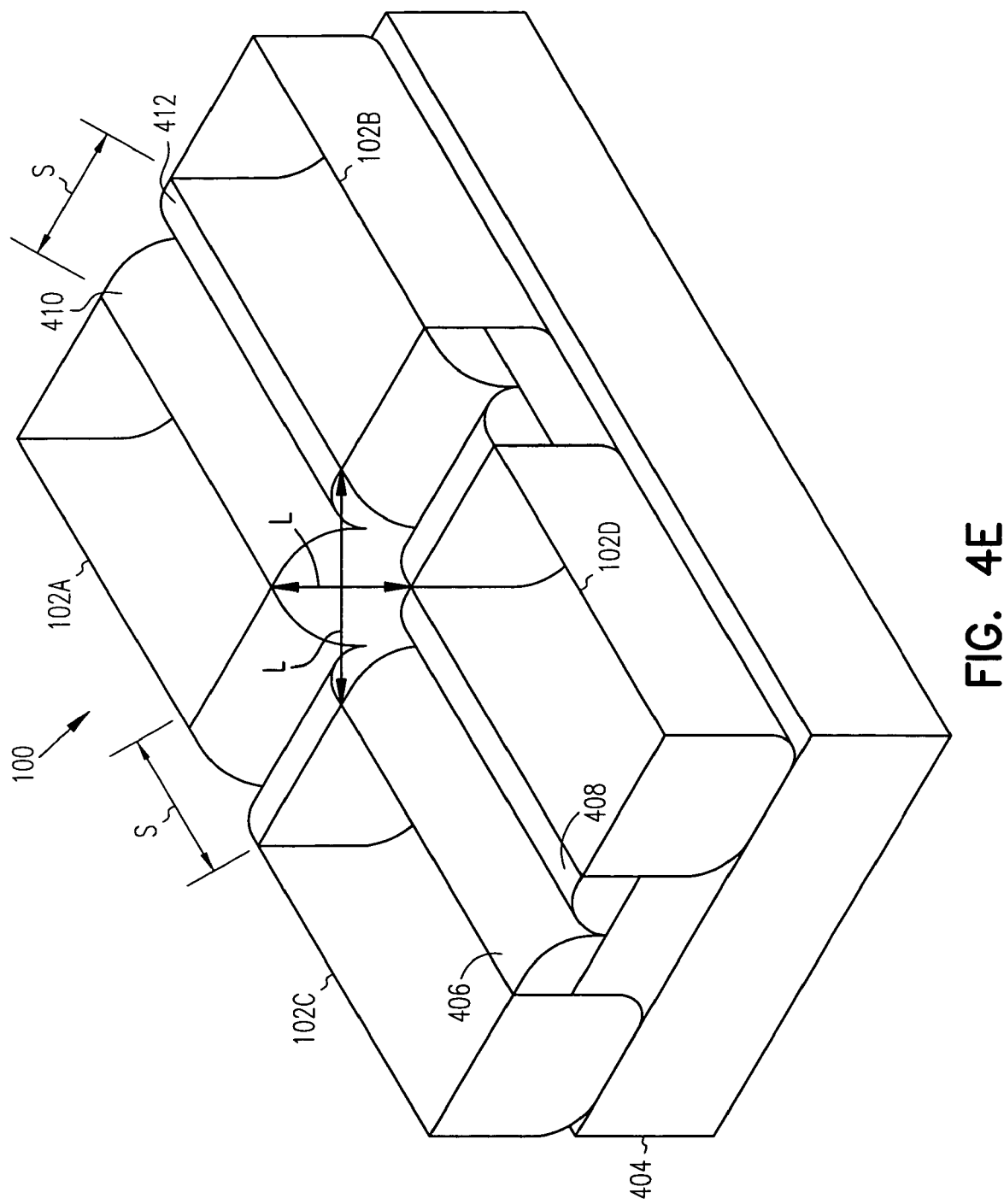
FIG. 4E illustrates a cross-sectional view of a memory array of FIG. 4D at a later stage of fabrication, according to one embodiment of the invention.

FIG. 4E illustrates a cross-sectional view of a memory array of FIG. 4D at a later stage of fabrication, according to one embodiment of the invention. In particular, referring to FIG. 4E, the method continues with a removal of the remaining mold 210. In one embodiment, the removal of the remaining mold 210 is based on a selective wet etch operation. Accordingly, even though of surface tension may form on the top layers of the memory array 100 during this wet etch operation, the collar material precludes the memory containers 102A-102D from leaning and/or sticking together.

Figure 4F:
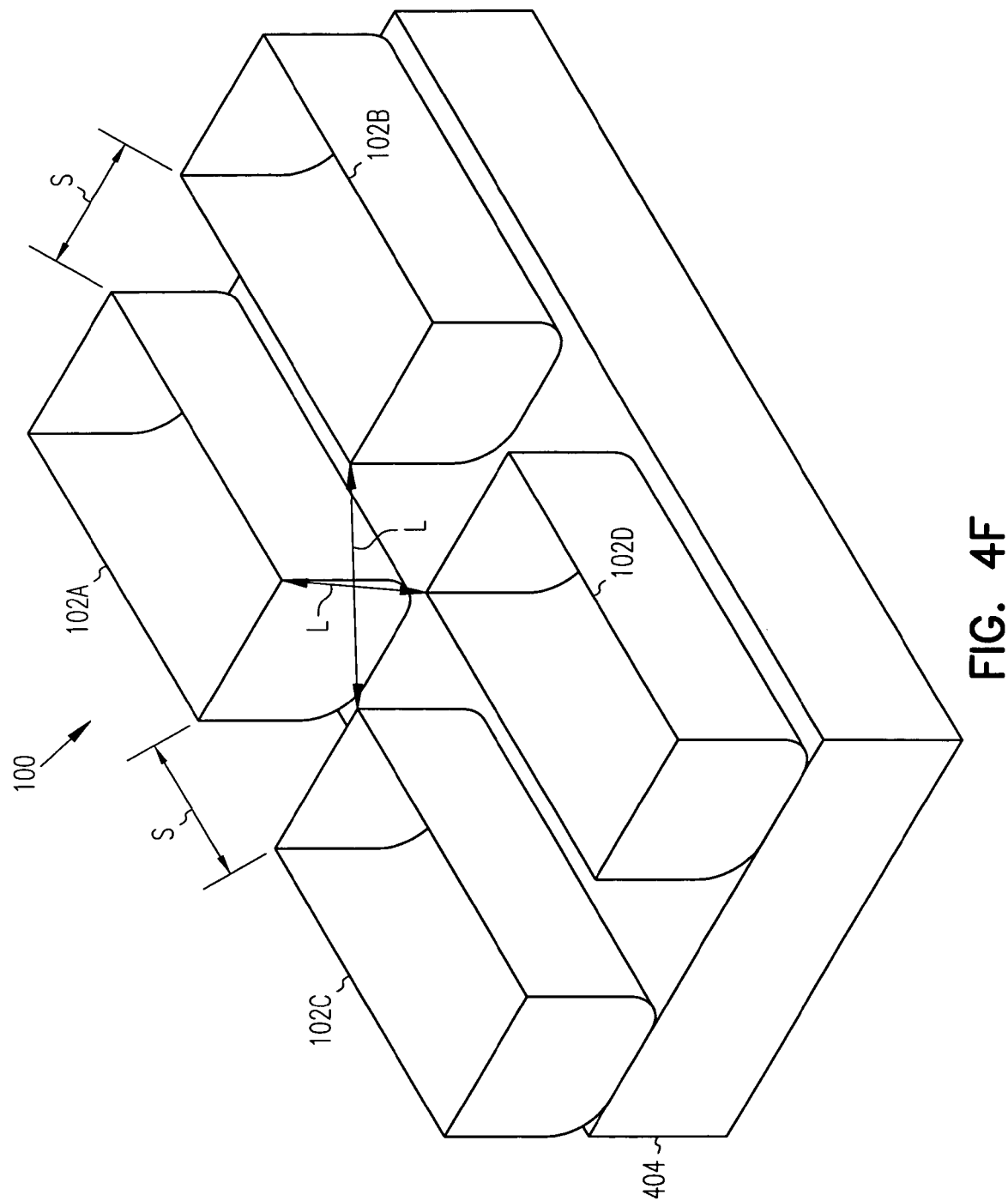
FIG. 4F illustrates a cross-sectional view of a memory array of FIG. 4E at a later stage of fabrication, according to one embodiment of the invention.

FIG. 4F illustrates a cross-sectional view of a memory array of FIG. 4E at a later stage of fabrication, according to one embodiment of the invention. In particular, referring to FIG. 4F, the method continues with the removal of the collar material. In one embodiment, the collar material may be removed using any of a number of different type of gas or vapor phase etch operations.

In one embodiment, the collar material may be removed using a plasma etch. In one such embodiment, the parameters for the plasma etch include an RF power from approximately 100 watts to approximately 1500 watts. In an embodiment, the parameters include a pressure at approximately 1 Torr. In one embodiment, the parameters include a pressure in a range of approximately 1 mTorr to 10 Torr.

In an embodiment, the collar material may be removed using a downstream microwave plasma etch. In one embodiment, the collar material may be removed using a downstream microwave plasma nitride etch. In one embodiment, the collar material may be removed using a down stream microwave plasma etch that includes $CF_4+O_2+N_2H_2$.

Those skilled in the art will recognize that a wide variety of etch operations can be substituted for the different etch operations described here, without departing from the scope of the appended claims. Moreover, while FIG. 4F illustrates the removal of the collar material, embodiments of the invention are not so limited. For example, in an embodiment, the collar material may be an insulator that may remain on the memory array 100.

While a number of materials can be combined with a number of different types of operations regarding such materials, a number of example combinations are now described. In one embodiment, the electrode includes a poly silicon; the mold includes BPSG; the collar material includes boron doped carbon film; and the container liner includes TiN. Additionally, in such an embodiment, the mold is etched with HF, while the container liner is removed with a piranha solution. Also, in such an embodiment, the collar material is etched with RF powered $H_2$ plasma at a pressure of approximately 1 Torr.

In an embodiment, the electrode includes a poly silicon; the mold includes BPSG; the collar material includes silicon nitride; and the container liner includes TiN. In such an embodiment, the mold is etched with acetic acid and HF, while the container liner is removed with a piranha solution. Also, in such an embodiment, the collar material is etched with downstream microwave plasma (that includes $CF_4+O_2+N_2H_2$).

In one embodiment, the electrode includes TiN; the mold includes BPSG; the collar material includes silicon nitride; and the container liner includes a type of poly material. In such an embodiment, the mold is etched with HF, while the container liner is removed with a TMAH solution. Also, in such an embodiment, the collar material is etched with downstream microwave plasma.

In one embodiment, the electrode includes poly silicon; the mold includes SA TEOS; the collar material includes boron doped carbon film; and the container liner includes TiN. In such an embodiment, the mold is etched with HF, while the container liner is removed with a piranha solution. Also, in such an embodiment, the collar material is etched with RF powered $H_2$ plasma at a pressure of approximately 1 Torr.

FIGS. 4A-4F illustrate one embodiment that allows for support for the memory containers while reducing the surface tension during etches of material adjacent to or surrounding such memory containers. However, embodiments of the invention are not so limited. For example, in another embodiment, the collar material is a negative tone resist that has been patterned to leave openings in the second direction (along the L distances) while still maintaining contact in the first direction (along the S distances). In particular, after the partial etch back of the mold 210 (as shown in FIG. 4B), the opposite tone resist is deposited. The opposite tone resist is exposed low enough to leave openings in the second direction along the L distance, while high enough to connect the memory containers in the first direction along the S distance.

In an alternative embodiment, a surface tension is controlled using a collar material that is a blanket photoresist and the mold 210 that includes an oxide. In one embodiment, the mold 210 includes an undoped oxide. The oxide-based mold 210 is then etched through the blanket photoresist using a vapor etch. In one such embodiment, after the partial etch back of the mold 210 (as shown in FIG. 4B), a positive tone resist is blanketed over the memory array 100. The mold 210 is vapor etched using HF. In one embodiment, the mold 210 is a doped oxide wherein the memory array 100 may be subsequently rinsed.

Memory Devices

Figure 5:
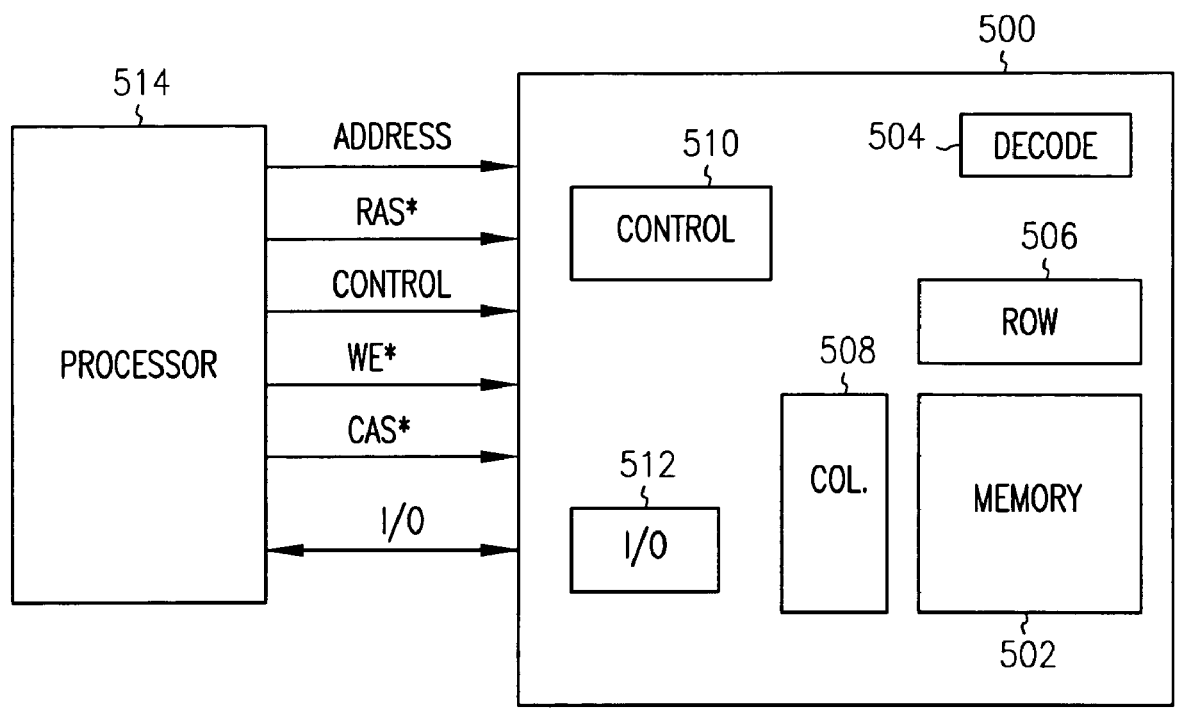
FIG. 5 is a simplified block diagram of a memory device, according to one embodiment of the invention.

FIG. 5 is a simplified block diagram of a memory device, according to one embodiment of the invention. FIG. 5 illustrates a memory device 500 includes an array of memory cells 502, an address decoder 504, a row access circuitry 506, a column access circuitry 508, a control circuitry 510, and an Input/Output (I/O) circuit 512. The memory device 500 is operably coupled to an external processor 514, or memory controller (not shown) for memory accessing. The memory device 500 receives control signals from the processor 514, such as WE*, RAS* and CAS* signals. The memory device 500 stores data which is accessed via I/O lines. It will be appreciated by those skilled in the art that additional circuitry and control signals can be provided, and that the memory device of FIG. 5 has been simplified to help focus on embodiments of the invention. At least one of the memory cells, transistors, or associated circuitry has an integrated circuit structure or element in accordance with embodiments of the invention. For example, the array of memory cells 502 may be fabricated according to embodiments of the invention.

It will be understood that the above description of a memory device is intended to provide a general understanding of the memory and is not a complete description of all the elements and features of a specific type of memory, such as DRAM (Dynamic Random Access Memory). Further, the embodiments of the invention are equally applicable to any size and type of memory circuit and are not intended to be limited to the DRAM described above. Other alternative types of devices include SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging DRAM technologies.

Semiconductor Dies

Figure 6:
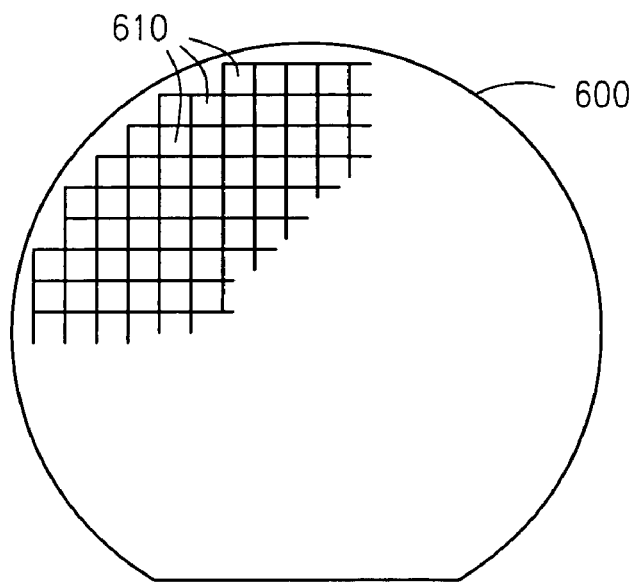
FIG. 6 illustrates a semiconductor die, according to one embodiment of the invention.

FIG. 6 illustrates a semiconductor die, according to one embodiment of the invention. As shown, a semiconductor die 610 is produced from a wafer 600. The semiconductor die 610 is an individual pattern, typically rectangular, on a substrate or wafer 600 that contains circuitry, or integrated circuit devices, to perform a specific function. The semiconductor wafer 600 will typically contain a repeated pattern of such semiconductor dies 610 containing the same functionality. The semiconductor die 610 is typically packaged in a protective casing (not shown) with leads extending there from (not shown) providing access to the circuitry of the die for unilateral or bilateral communication and control. The semiconductor die 610 may include an integrated circuit structure or element in accordance with embodiments of the invention.

Circuit Modules

Figure 7:
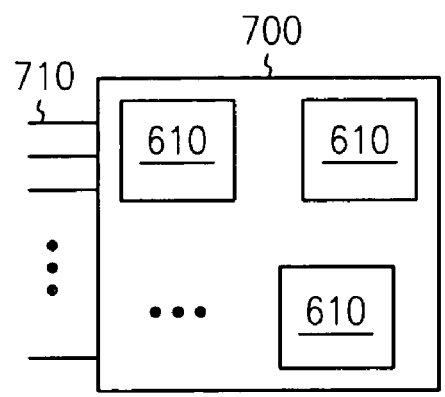
FIG. 7 illustrates a circuit module, according to one embodiment of the invention.

FIG. 7 illustrates a circuit module, according to one embodiment of the invention. As shown in FIG. 7, two or more semiconductor dies 610 may be combined, with or without protective casing, into a circuit module 700 to enhance or extend the functionality of an individual semiconductor die 610. The circuit module 700 may be a combination of semiconductor dies 610 representing a variety of functions, or a combination of semiconductor dies 610 containing the same functionality. One or more semiconductor dies 610 of circuit module 700 may contain at least one integrated circuit structure or element in accordance with embodiments of the invention.

Some examples of a circuit module include memory modules, device drivers, power modules, communication modems, processor modules and application-specific modules, and may include multilayer, multichip modules. The circuit module 700 may be a subcomponent of a variety of electronic systems, such as a clock, a television, a cell phone, a personal computer, an automobile, an industrial control system, an aircraft and others. The circuit module 700 may have a variety of leads 710 extending there from and coupled to the semiconductor dies 610 providing unilateral or bilateral communication and control.

Figure 8:
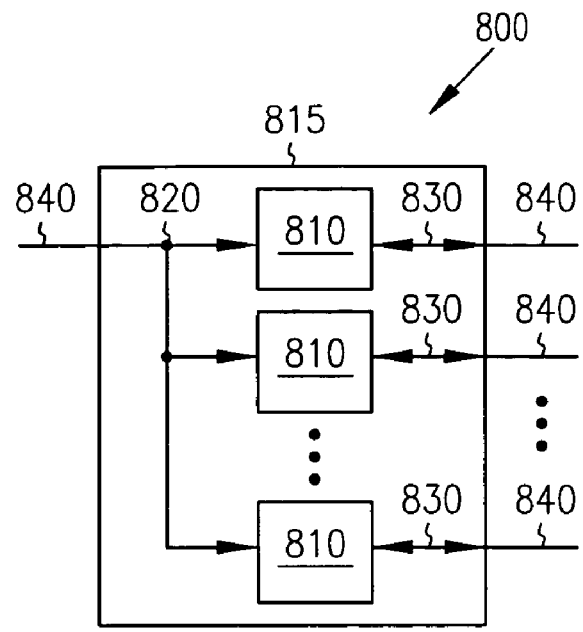
FIG. 8 illustrates a circuit module as a memory module, according to one embodiment of the invention.

FIG. 8 illustrates a circuit module as a memory module, according to one embodiment of the invention. A memory module 800 contains multiple memory devices 810 contained on a support 815 (the number generally depending upon the desired bus width and the desire for parity). The memory module 800 accepts a command signal from an external controller (not shown) on a command link 820 and provides for data input and data output on data links 830. The command link 820 and data links 830 are connected to leads 840 extending from the support 815. The leads 840 are shown for conceptual purposes and are not limited to the positions shown in FIG. 8. At least one of the memory devices 810 may contain an integrated circuit structure or element in accordance with embodiments of the invention.

Electronic Systems

Figure 9:
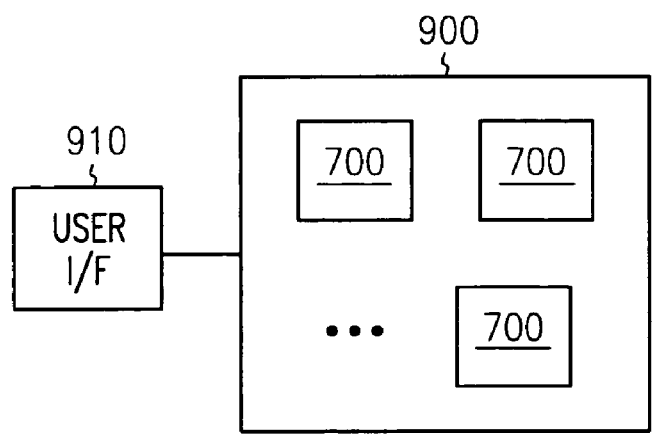
FIG. 9 illustrates a block diagram of an electronic system, according to one embodiment of the invention.

FIG. 9 illustrates a block diagram of an electronic system, according to one embodiment of the invention. FIG. 9 shows one embodiment of an electronic system 900 containing one or more circuit modules 700. The electronic system 900 generally contains a user interface 910. The user interface 910 provides a user of the electronic system 900 with some form of control or observation of the results of the electronic system 900. Some examples of the user interface 910 include the keyboard, pointing device, monitor or printer of a personal computer; the tuning dial, display or speakers of a radio; the ignition switch, gauges or gas pedal of an automobile; and the card reader, keypad, display or currency dispenser of an automated teller machine, or other human-machine interfaces. The user interface 910 may further describe access ports provided to electronic system 900. Access ports are used to connect an electronic system to the more tangible user interface components previously exemplified. One or more of the circuit modules 700 may be a processor providing some form of manipulation, control or direction of inputs from or outputs to user interface 710, or of other information either preprogrammed into, or otherwise provided to, electronic system 900. As will be apparent from the lists of examples previously given, the electronic system 900 will often be associated with certain mechanical components (not shown) in addition to the circuit modules 700 and the user interface 910. It will be appreciated that the one or more circuit modules 700 in the electronic system 900 can be replaced by a single integrated circuit. Furthermore, the electronic system 900 may be a subcomponent of a larger electronic system. It will also be appreciated that at least one of the memory modules 700 may contain an integrated circuit structure or element in accordance with embodiments of the invention.

Figure 10:
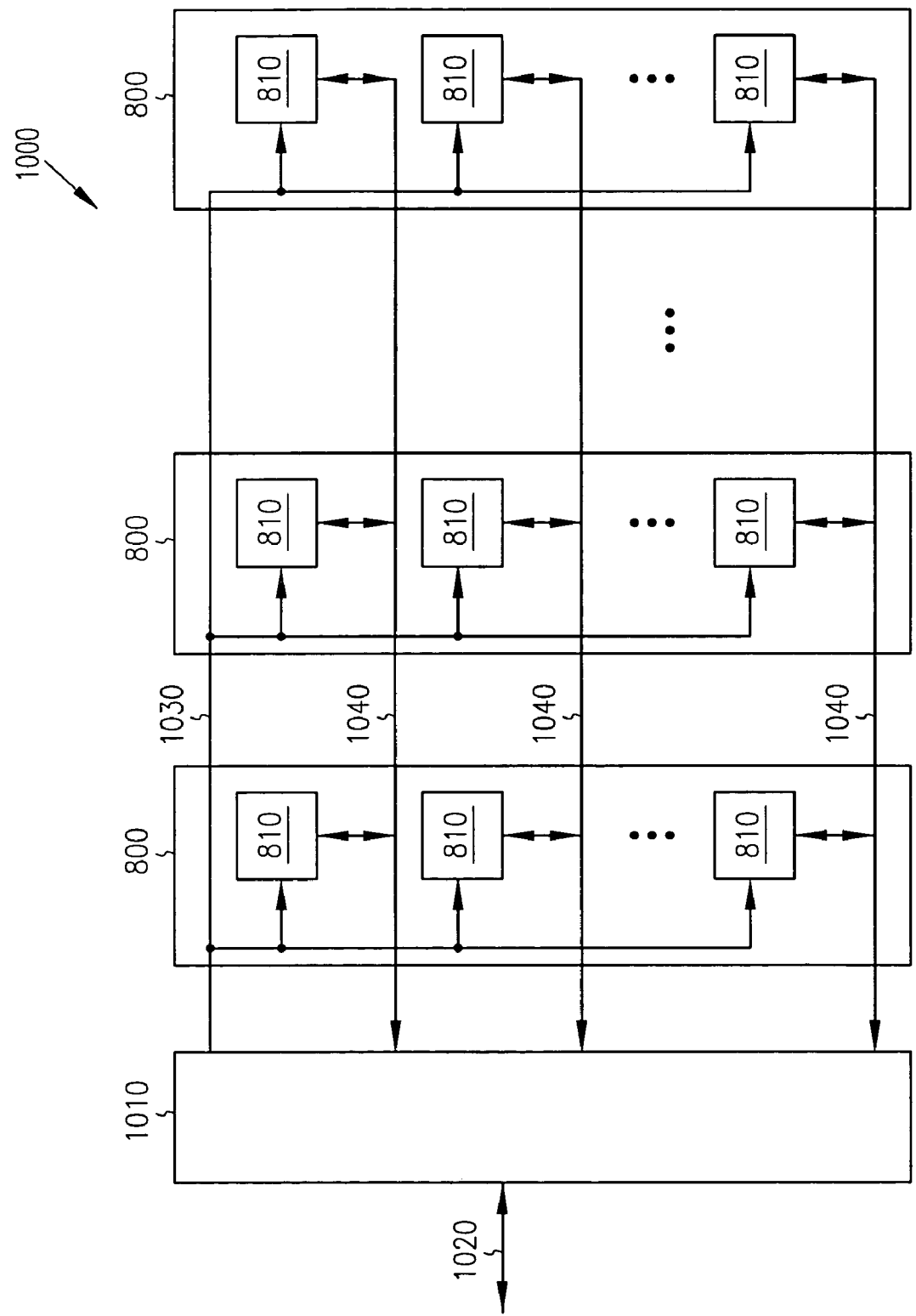
FIG. 10 illustrates a block diagram of an electronic system as a memory system, according to one embodiment of the invention.

FIG. 10 illustrates a block diagram of an electronic system as a memory system, according to one embodiment of the invention. A memory system 1000 contains one or more memory modules 800 and a memory controller 1010. The memory modules 800 each contain one or more memory devices 810. At least one of memory devices 810 may contain an integrated circuit structure or element in accordance with embodiments of the invention.

The memory controller 1010 provides and controls a bidirectional interface between the memory system 1000 and an external system bus 1020. In an embodiment, the memory controller 1010 may contain an integrated circuit structure or element in accordance with embodiments of the invention. The memory system 1400 accepts a command signal from the external system bus 1020 and relays it to the one or more memory modules 800 on a command link 830. The memory system 1000 provides for data input and data output between the one or more memory modules 800 and the external system bus 1020 on data links 1040.

Figure 11:
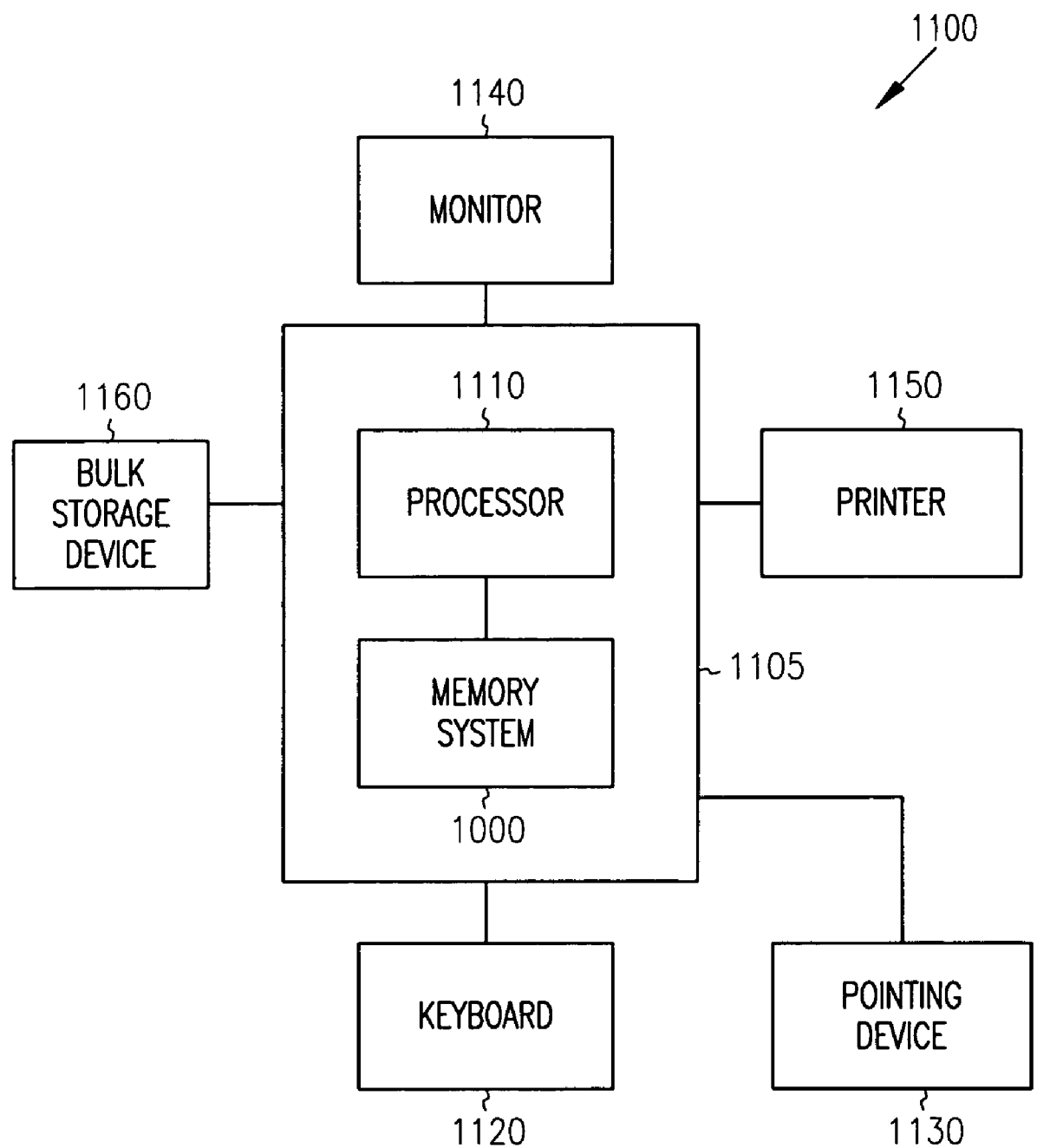
FIG. 11 illustrates a block diagram of an electronic system as a computer system, according to one embodiment of the invention.

FIG. 11 illustrates a block diagram of an electronic system as a computer system, according to one embodiment of the invention. A computer system 1100 contains a processor 1110 and a memory system 1000 housed in a computer unit 1105. The computer system 1100 is but one example of an electronic system containing another electronic system, i.e., memory system 1000, as a subcomponent. The computer system 1100 optionally contains user interface components. Depicted in FIG. 11 are a keyboard 1120, a pointing device 1130, a monitor 1140, a printer 1150 and a bulk storage device 1160. It will be appreciated that other components are often associated with the computer system 1100 such as modems, device driver cards, additional storage devices, etc. It will further be appreciated that the processor 1110 and the memory system 1000 of computer system 1100 can be incorporated on a single integrated circuit. Such single package processing units reduce the communication time between the processor and the memory circuit. It will be appreciated that at least one of the processor 1110 and the memory system 1000 may contain an integrated circuit structure or element in accordance with embodiments of the invention. In an embodiment, the printer 1150 or the bulk storage device 1160 may contain an integrated circuit structure or element in accordance with embodiments of the invention.

CONCLUSION

Thus, methods, apparatuses and systems for different embodiments for semiconductor fabrication using a collar have been described. As illustrated, embodiments of the invention provide for a geometric configuration of a number of memory containers, wherein collars (spacers) provide support in a first direction and enabling access to the underlying material in a second direction. Such support precludes the memory containers from leaning and/or sticking together (due to capillary forces) during a wet etching of the underlying material.

Although specific embodiments have been illustrated and described herein, it will be appreciated by those of ordinary skill in the art that any arrangement which is calculated to achieve the same purpose may be substituted for the specific embodiments shown. Adaptations of the invention will be apparent to those of ordinary skill in the art. For example, while described with reference to memory containers (that may have a side wall with a double-sided capacitor), embodiments of the invention may be applicable to other structures wherein the amount of surface tension is to remain low to preclude damage to surrounding/adjacent structures. Accordingly, this application is intended to cover any adaptations or variations of the invention. It is manifestly intended that this invention be limited only by the following claims and equivalents thereof.

What is claimed is:

1. An array of memory cells comprising:
 a substrate;
 a number of memory containers formed on the substrate, wherein a first memory container of the number of memory containers is located a first distance, S, from a first adjacent memory container of the number of memory containers in a first direction and wherein the first memory container is located a second distance, L, from a second adjacent memory container of the number of memory containers in a second direction, wherein S is less than L; and
 a collar comprised of silicon nitride and formed on external side walls of the number of memory containers, wherein the collar formed on the external side walls is thicker than S/2 and thinner than L/2.

2. The array of memory cells of claim 1, wherein the number of memory containers are formed on the substrate by:
 dry etching mold located between the first memory container and the second adjacent memory container between the collar material; and
 wet etching mold under the collar.

3. The array of memory cells of claim 2, wherein the mold includes borophosphosilicate glass.

4. The array of memory cells of claim 2, wherein the mold includes tetraethylortho-silicate.

5. The array of memory cells of claim 2, wherein the mold includes SiLK.

6. The array of memory cells of claim 1, wherein the number of memory containers have at least one side wall that includes a double-sided capacitor.

7. An integrated circuit device comprising:

a substrate; and an array of memory cells formed, using a number of memory containers, on the substrate based on a selective deposition of a collar material between the number of memory containers, wherein a part of the collar material along a side wall of a first memory container of the number of memory containers is in contact with a part of the collar material along a side wall of a second memory container, a distance between the side wall of the first memory container and the side wall of the second memory container is S, wherein an opening exists between a part of the collar material along a corner of the first memory container and a part of the collar material along a corner of a third memory container, a distance between the corner of the first memory container and the corner of the third memory container is L, and wherein the distance L is greater than the distance S.

8. The integrated circuit device of claim 7, wherein the collar material includes a boron-doped carbon film.

9. The integrated circuit device of claim 7, wherein at least one side of the number of memory containers includes a double-sided capacitor.

10. The integrated circuit device of claim 9, wherein an electrode of the double-sided capacitor includes poly silicon.

11. A memory device comprising:

a substrate; and a number of memory cells fabricated on the substrate wherein the number of memory cells comprise:

a number of memory containers, wherein a first memory container of the number of memory containers is located a first distance, S, from a first adjacent memory container of the number of memory containers in a first direction and wherein the first memory container is located a second distance, L, from a second adjacent memory container of the number of memory containers in a second direction, wherein a collar material, deposited between the number of memory containers during the fabrication of the number of memory cells, is thicker than S/2 and thinner than L/2 along side walls of the number of memory containers.

12. The memory device of claim 11, wherein the number of memory containers are fabricated in a mold that includes phosphosilicate glass.

13. The memory device of claim 11, wherein the number of memory containers are fabricated in a mold that includes tetraethylortho-.silicate.

14. The memory device of claim 11, wherein the number of memory containers are fabricated in a mold that includes SiLK.

15. The memory device of claim 11, wherein the collar material includes silicon nitride.

16. A memory comprising:

an array of memory cells formed in a number of memory containers in a tetraethylortho-silicate (TEOS), wherein a first memory container of the number of memory containers is located in a first direction from a first adjacent memory container of the number of memory containers and wherein the first memory container is located in a second direction from a second adjacent memory container of the number of memory containers and wherein a collar material, that includes boron doped carbon film is between the number of memory containers, wherein the collar material along a first side wall of the first memory container is in contact with the collar material along a side wall of the first memory adjacent container in the first direction and wherein the collar material approximately along a corner of the first memory container is not in contact with the collar material approximately along a corner of the second adjacent memory container in the second direction.

17. The memory of claim 16, wherein the array of memory cells is further formed by a dry etch, with hydrogen fluoride, the TEOS located between the corner of the first memory container and the corner of the second adjacent memory container in the second direction.

18. The memory of claim 16, wherein the array of memory cells is further formed by a wet etch of remaining TEOS.

19. The memory of claim 16, wherein the array of memory cells is further formed by an etch the collar material with $H_2$-based plasma.

* * * * *

UNITED STATES PATENT AND TRADEMARK OFFICE
CERTIFICATE OF CORRECTION

PATENT NO. : 7,541,635 B2
APPLICATION NO. : 11/490770
DATED : June 2, 2009
INVENTOR(S) : Kevin Torek et al.

It is certified that error appears in the above-identified patent and that said Letters Patent is hereby corrected as shown below:

On the title page, item (57), under "Abstract", in column 2, line 7, before "memory" insert -- first --.

In column 14, line 6, in Claim 13, delete "tetraethylortho-.silicate." and insert -- tetraethylortho-silicate. --, therefor.

In column 14, line 21, in Claim 16, delete "film" and insert -- film, --, therefor.

Signed and Sealed this

Twenty-eighth Day of July, 2009

JOHN DOLL
*Acting Director of the United States Patent and Trademark Office*